(12) United States Patent
Hesse et al.

(10) Patent No.: US 8,434,659 B2
(45) Date of Patent: May 7, 2013

(54) BONDING DEVICE, ULTRASONIC TRANSDUCER, AND BONDING METHOD

(75) Inventors: Hans-Juergen Hesse, Paderborn (DE); Joerg Wallaschek, Paderborn (DE); Michael Broekelmann, Delbrueck (DE); Piotr Vasiljev, Vilnius (LT)

(73) Assignee: Hesse & Knipps GmbH, Paderborn (DE)

( * ) Notice: Subject to any disclaimer, the term of this patent is extended or adjusted under 35 U.S.C. 154(b) by 0 days.

(21) Appl. No.: 13/123,745

(22) PCT Filed: Oct. 7, 2009

(86) PCT No.: PCT/EP2009/063000
§ 371 (c)(1),
(2), (4) Date: Apr. 12, 2011

(87) PCT Pub. No.: WO2010/043517
PCT Pub. Date: Apr. 22, 2010

(65) Prior Publication Data
US 2011/0266329 A1    Nov. 3, 2011

(30) Foreign Application Priority Data

Oct. 14, 2008  (DE) .................. 10 2008 037 450
Jan. 6, 2009   (DE) .................. 10 2009 003 312

(51) Int. Cl.
*B23K 1/06*   (2006.01)
(52) U.S. Cl.
USPC ........ 228/110.1; 228/111; 228/1.1; 156/73.1; 156/580.1
(58) Field of Classification Search ............... 228/110.1, 228/1.1, 111; 156/73.1, 580.1
See application file for complete search history.

(56) References Cited

U.S. PATENT DOCUMENTS

| | | | |
|---|---|---|---|
| 3,549,913 A | 12/1970 | Moriki et al. | |
| 3,602,420 A | 8/1971 | Wilkinson, Jr. | |
| 5,046,654 A * | 9/1991 | Yamazaki et al. | ............. 228/1.1 |
| 2001/0054230 A1 | 12/2001 | Finn et al. | |

(Continued)

FOREIGN PATENT DOCUMENTS

| | | |
|---|---|---|
| DE | 19601599 C1 | 2/1997 |
| DE | 10114672 A1 | 9/2002 |

(Continued)

OTHER PUBLICATIONS computer english translation of WO 2008090251 A2.*

(Continued)

*Primary Examiner* — Erin Saad
(74) *Attorney, Agent, or Firm* — Patent Central LLC; Stephan A. Pendorf

(57) ABSTRACT

A bonding device, particularly for producing bond connections between electrical conductors made of wire material or strip material and contact points of substrates such as electrical circuits, wherein the bonding device comprises a bonding head (2) which can be rotated about a geometric axis of rotation (D), in particular a vertical axis, and on which a bonding tool (5) and an ultrasonic transducer (35) are disposed for ultrasonic vibration excitation of the bonding tool (5). It is proposed that the main direction of extension (36) of the ultrasonic transducer (35) and/or the direction of extension thereof in the direction of the axis of the minimum moment of inertia extends parallel to the geometric axis of rotation (D) of the bonding head (2). The invention further relates to a bonding device or an ultrasonic transducer.

14 Claims, 10 Drawing Sheets

U.S. PATENT DOCUMENTS

| | | |
|---|---|---|
| 2006/0208615 A1 | 9/2006 | Kasuga et al. |
| 2006/0283253 A1 | 12/2006 | Koc et al. |
| 2007/0236107 A1 | 10/2007 | Maruyama et al. |
| 2010/0127599 A1* | 5/2010 | Thuerlemann et al. .. 310/323.18 |
| 2010/0147466 A1* | 6/2010 | Sans Marimon ........... 156/580.2 |

FOREIGN PATENT DOCUMENTS

| | | |
|---|---|---|
| GB | 1164600 A | 9/1969 |
| GB | 1326692 A | 8/1973 |
| JP | 6053291 A | 2/1994 |
| WO | WO 2008090251 A2 * | 7/2008 |
| WO | WO 2008122499 A2 * | 10/2008 |

OTHER PUBLICATIONS computer english translation of WO 2008122499 A2.*

* cited by examiner

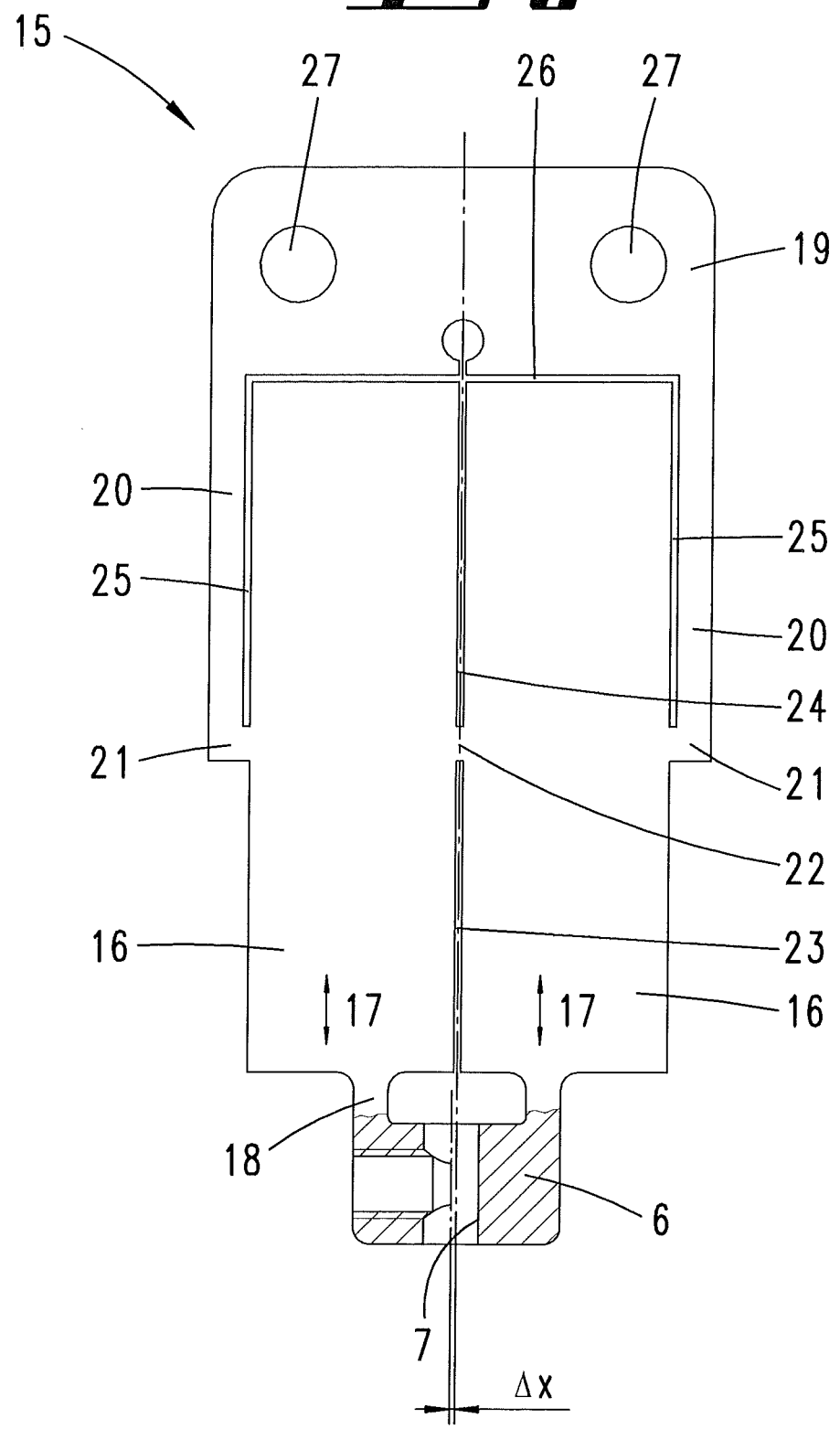

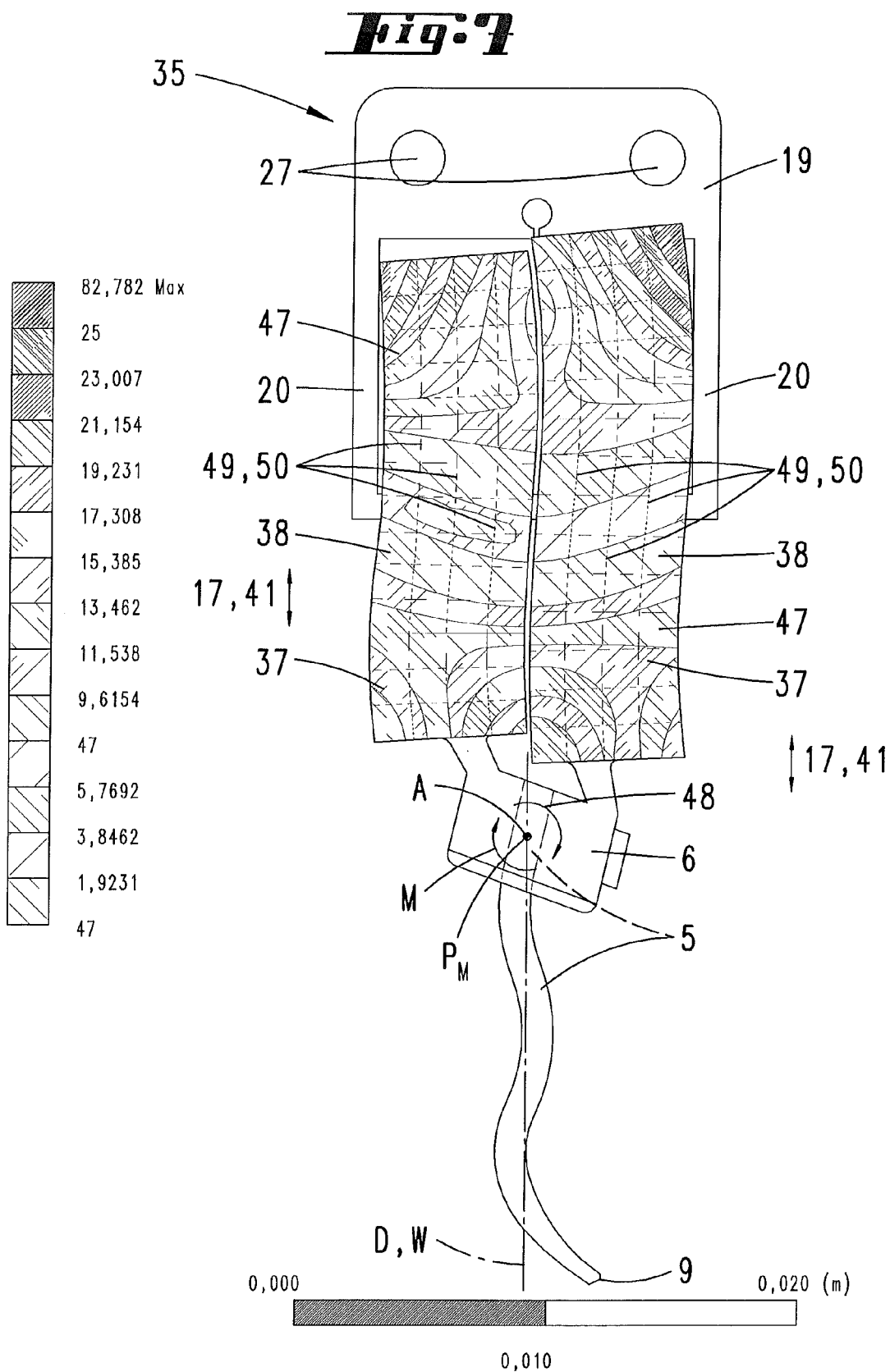

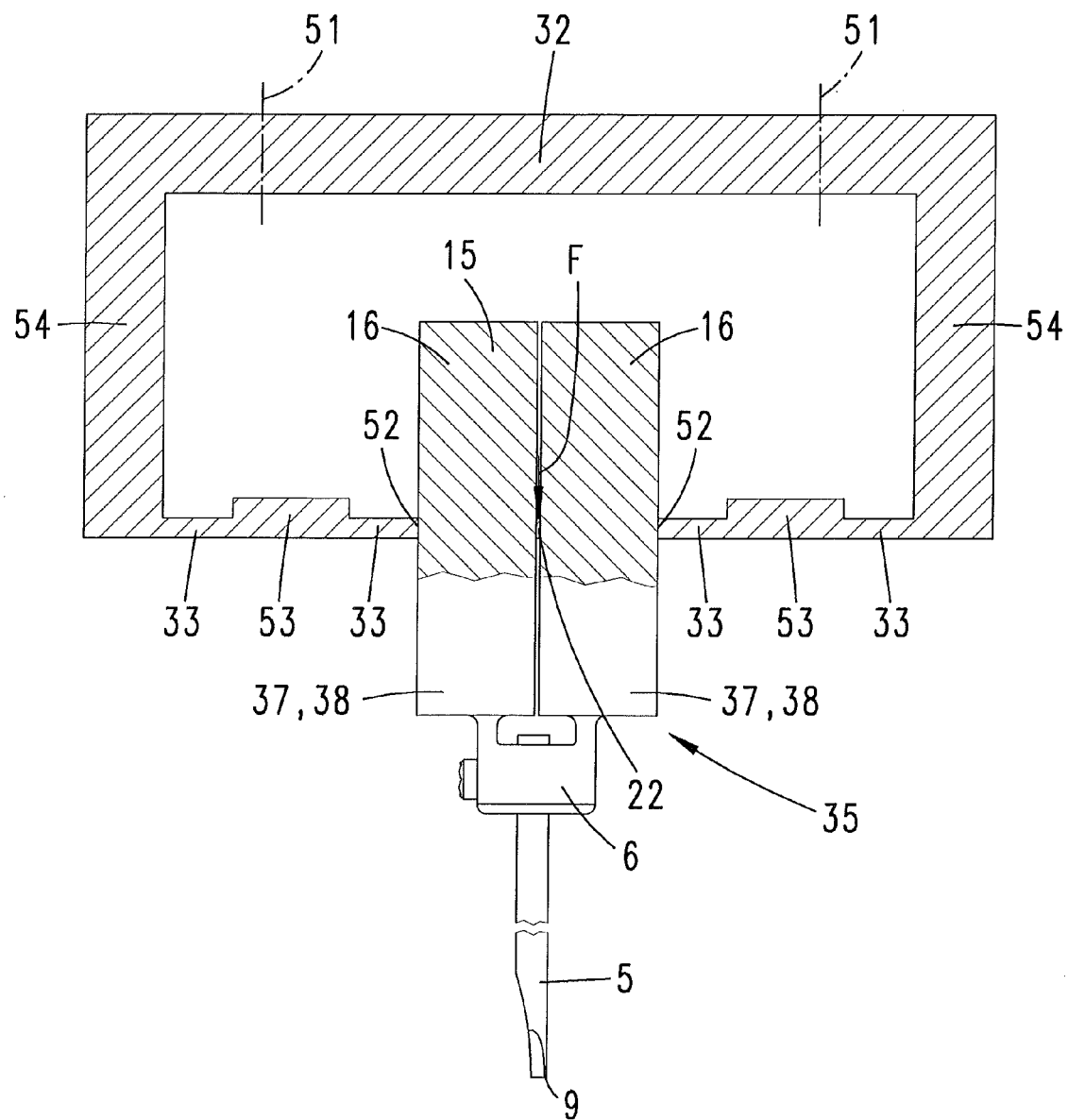

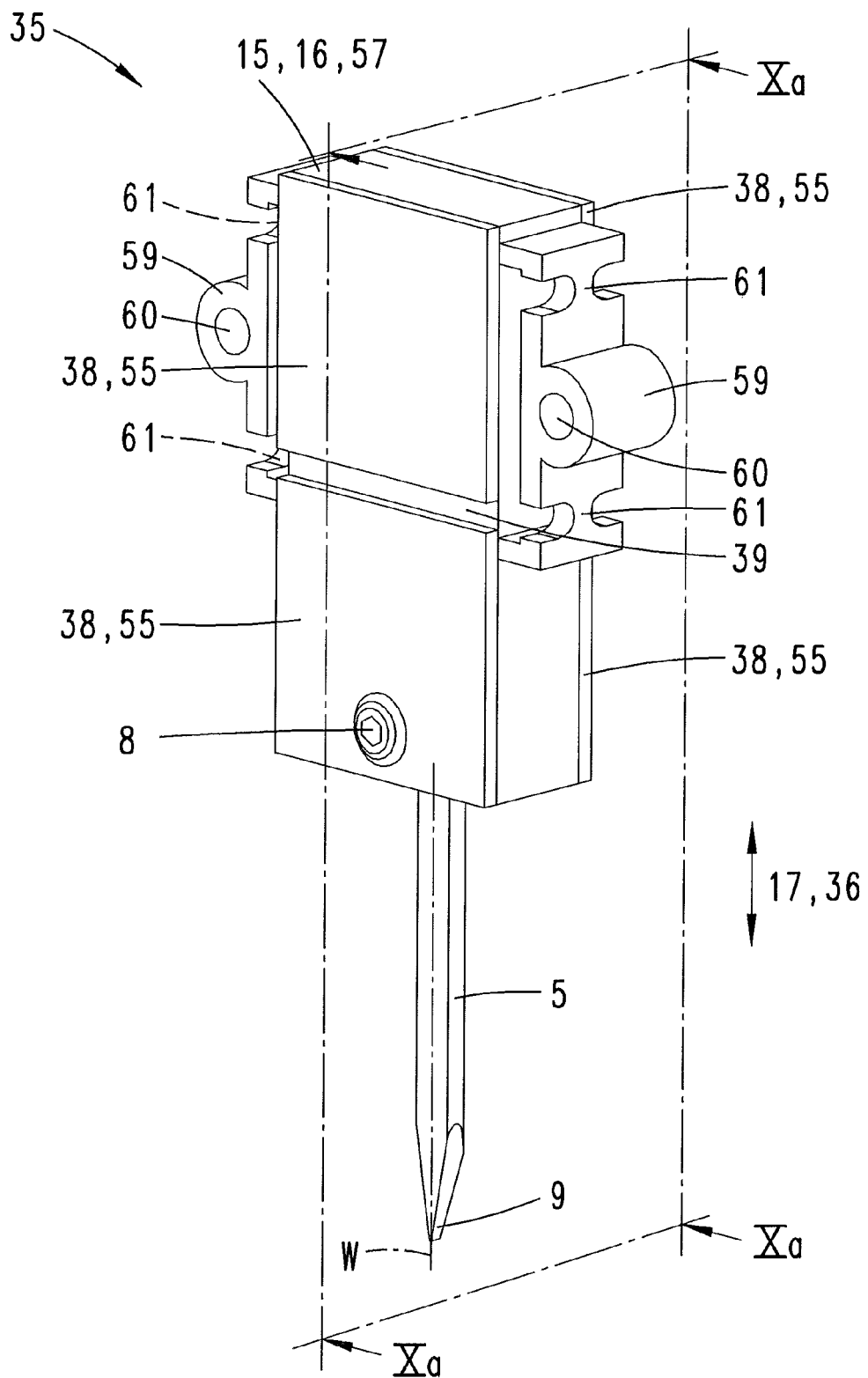

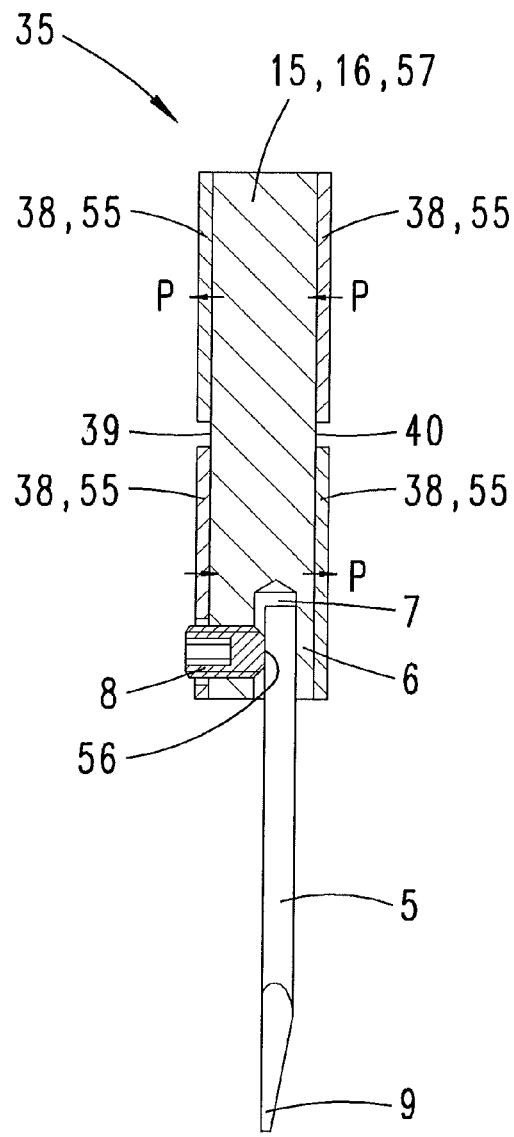
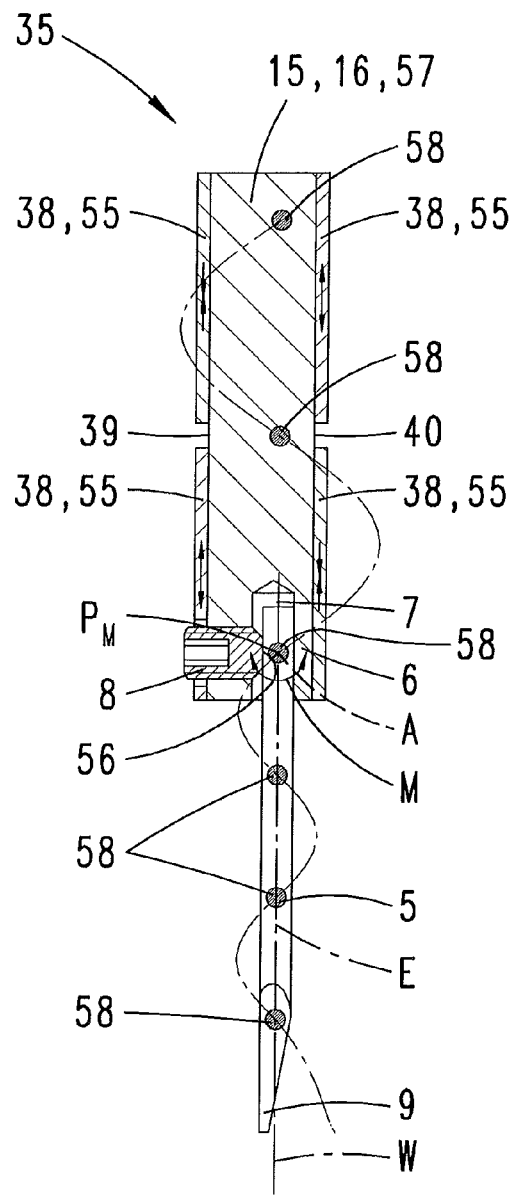

BONDING DEVICE, ULTRASONIC TRANSDUCER, AND BONDING METHOD

BACKGROUND OF THE INVENTION

1. Field of the Invention

The invention relates to a bonding device, particularly for producing bond connections between electrical conductors made of wire material or strip material and contact points of substrates such as, in particular, electrical circuits, wherein the bonding device comprises a bonding head which can be rotated about a geometric axis of rotation, in particular a vertical axis, and on which a bonding tool and an ultrasonic transducer are disposed for ultrasonic vibration excitation of the bonding tool.

As is known such bonding devices perform in a way that by means of a bonding tool, that in a common embodiment could be a so-called wedge, an area of an electrical conductor that is to be bonded, e.g. an Aluminum or Gold wire, is pushed against the targeted contact point of a substrate, e.g. an electrical circuit, with a defined compressive force, while the bonding tool is performing ultrasonic oscillations perpendicular to the direction of the compressive force and transmits those oscillations into the conductor until a permanent so-called bond connection is established between the conductor and the contact point. For the excitation of the ultrasonic oscillation of the bonding tool so-called ultrasonic transducers are utilized, that typically use stacks of plate-shaped piezo elements as oscillation drivers. The piezo elements are usually connected to an alternating voltage such that the piezo elements perform consecutive elongations and contractions predominantly perpendicular to the planes of the plates and therefore in the longitudinal direction of the piezo element stack. These periodical alternations of length usually excite the tool holder of the bonding tool to perform longitudinal mechanical oscillations in the direction of the periodical alternations of length. As tool holder often a conically reducing horn that elongates into the same direction is utilized with the bonding tool attached to its tip, e.g. by means of a clamping screw, such that the longitudinal axis of the tool is perpendicular to the longitudinal axis of the transducer, i.e. perpendicular to the direction of the oscillation. As a result the tip of the tool also performs an oscillating movement transverse to the tool's longitudinal axis that is utilized to produce a bond connection. Bonding devices with ultrasonic transducers provide numerous advantages and are used in a multitude of applications. Frequently there is a requirement to produce a number of bond connections within a small area, wherein the so-called bonding head, i.e. the subassembly of the bonding device containing the bonding tool and the ultrasonic transducer (as well as usually a wire guide and as the case my be for so-called thick wire bonders a cutting tool) are mounted, needs to perform quick rotary motions around a vertically oriented geometrical axis of rotation. The fact that a conventional ultrasonic transducer equipped with a bonding head due to its function and hence its design exhibits a large mass moment of inertia is regarded as a constraining factor, hampering the rotation of the bonding head and accordingly requires large rotary drives.

2. Description of the Related Art

In this context it is the objective of the invention to further develop a bonding device of the aforementioned kind such that particularly the disadvantages described above are largely avoided.

BRIEF SUMMARY OF THE INVENTION

The objective is accomplished by the invention firstly and fundamentally by an embodiment wherein the main direction of extension of the ultrasonic transducer and/or the direction of extension thereof in the direction of the axis of the minimum moment of inertia (with or without lateral distance) extends parallel to the geometric axis of rotation of the bonding head. The aforementioned main direction is the extension direction of the ultrasonic transducer, wherein it exhibits its largest physical dimension in comparison to its extension direction. Also the aforementioned axis of rotation of the bonding head is primarily a geometrical, i.e. not necessarily a constructional axis. With the chosen solution according to the invention a reduction of the mass moment of inertia with respect to the geometrical bond head axis of rotation is achieved, in comparison to conventional bonding devices with a main direction of extension of the ultrasonic transducer perpendicular to the geometrical axis of rotation of the bonding head.

Therefore faster rotations of the bonding head with respect to its perpendicular geometric axis of rotation are possible respectively smaller drive systems are necessary for the rotational drives in comparison.

A second embodiment according to the invention features an ultrasonic transducer, particularly for a bonding device for the ultrasonic oscillation excitation of the bonding tool of the bonding device, wherein the ultrasonic transducer comprises at least one oscillation exciter and the oscillation exciter comprises at least one piezo element, and wherein an ultrasonic energy source, particularly a voltage source is utilized to apply an alternating electrical voltage to the piezo element.

Based on the aforementioned state of the art the objective of the invention is to further develop such ultrasonic transducer to achieve advantages with respect to manufacturing technology and/or its application.

This objective is accomplished by the invention firstly and fundamentally by an embodiment wherein the ultrasonic energy source, particularly the voltage source, preferably its frequency, and in particular its voltage frequency, is matched to or adjustable such that during operation, particularly when an alternating voltage is applied, the main direction of deformation of the oscillation exciter and/or the main direction of deformation of the piezo element extends laterally respectively perpendicularly to the polarization direction of the piezo element. This embodiment represents a fundamental departure from transducer designs according to the state of the art, wherein the main direction of deformation of the oscillation exciter (e.g. a stack of piezo element plates), respectively the main direction of deformation of the piezo elements themselves, is arranged parallel to the main deformation direction of the piezo elements. At this the main deformation direction is defined as the spatial direction in which compared to other directions the largest deformations occur (i.e. contractions and elongations) caused by the applied alternating electrical voltage. The polarization direction is a property of the piezo element, a directional orientation achieved by a forced alignment of dipoles in an electrical filed during the manufacturing process of piezo elements and for the most part remains after the manufacturing process is completed (so-called remanent polarization). Through Application of an alternating voltage to the piezo element it generally experiences alternating contractions and elongations in all spatial directions, in which the respective magnitude and amount in the different spatial directions usually varies. The invention is based on the knowledge that specific alternating voltages exist, that in a case by case specifically allocated single spatial direction (e.g. geometrical axis of the body) result in an elongation of a larger magnitude compared to other spatial directions, in which these frequencies are also dependent on the form and the dimensions of the piezo element as well as the case may be dependent on adjacent respectively resonant components. According to the invention the proposed embodiments provide at defined voltages comparatively high field strengths particularly with the usage of plate shaped respectively thin piezo elements with a polarization direction extending perpendicular respectively lateral to the plate plane and thus create transmittable forces through changes in physical shape. Additional advantages are the achievement of increasing degrees of freedom for designing the transducers and the possibility of a simplified assembly of the piezo elements. The invention includes a bonding device particularly for producing bonding connections between electrical conductors made of wire material or strip material and contact points of substrates such as, in particular, electrical circuits, wherein the bonding device comprises a bonding head comprising a bonding tool and an ultrasonic transducer as described above.

A third embodiment of the invention comprises an ultrasonic transducer for the ultrasonic oscillation excitation of a bonding tool wherein the ultrasonic transducer comprises at least two interspaced oscillation exciters connected to a tool holder and which comprises at least one ultrasonic energy source for the supply of the oscillation exciters, particularly at least one voltage source to apply alternating electrical voltage to the oscillation exciter.

Based on the aforementioned the objective of the invention is to provide an advantageous embodiment of such bonding device.

According to the invention the objective is firstly and fundamentally accomplished by an embodiment wherein one or more ultrasonic energy sources, in particular the voltage source or the voltage sources, preferably the frequency and/or the phase position e.g. of the alternating voltage or alternating voltages thereof, are chosen or adjustable to the construction of the oscillation exciter in such manner that in operation, particularly with applied alternating voltage, the main directions of deformation of the two oscillation exciters are parallel or mainly parallel to each other and the deformations that change in time of the two oscillation exciters are phase shifted with respect to each other, preferably by half a period, i.e. phase shifted by 180°. The term period in this context is used in place or as an equivalent to the term phase length, and a phase shift of 180° (antiphase) represents half a phase length forward in a phase shift. With respect to its third embodiment the invention also comprises a bonding device particularly for producing bonding connections between electrical conductors made of wire material or strip material and contact points of substrates such as, in particular, electrical circuits, wherein the bonding device comprises a bonding head comprising a bonding tool, preferably a wedge, that is held by a tool holder, and an ultrasonic transducer according to the invention as described above. By utilizing several, preferably two, piezo elements that are interspaced with respect to each other, attached to the tool holder, and that perform different time-deformation-characteristics, the tool holder performs an oscillating rotational movement and transmits this movement onto the end of the preferably elongated bonding tool held by the tool holder. By means of the periodically changing rotational angle of the tool holder respectively by the oscillating transversal torsional moment transmitted to the bonding tool, the bonding tool is excited to perform transversal oscillations, i.e. oscillations perpendicular or lateral to its linear expansion respectively its main direction of extension. But this oscillation also called flexural oscillation or transverse oscillation is in contrast to the state of the art not excited at the position of the so-called antinode, but preferably at the position of the so-called node of the frequency dependent mode of oscillation. The transverse oscillation is transmitted to the entire bonding tool and causes in connection with an appropriate design respectively configuration of the bonding tool that also the bonding tool tip performs oscillations transversal to the longitudinal direction of the bonding tool, that can be transmitted to an electrical conductor for the production of a bond connection by pressing the bonding tool against said conductor.

It is understood that in the context of the invention also combinations of the characteristics of each two or all of the three aforementioned embodiments of the invention are possible. In principle all known piezo element types for piezo actuators could be used as piezo elements at which the use of piezo-electrical ceramics or piezo-electric crystals is preferred.

In particular in connection with the first embodiment of the invention it is preferred that the geometrical longitudinal center line of the ultrasonic transducer is oriented parallel to the geometrical rotational axis of the bonding head and/or parallel to the longitudinal center line of the bonding tool. Thus the moment of inertia with respect to the bonding head rotational axis can be reduced. There is also the possibility that the ultrasonic transducer comprises at least one oscillation exciter, preferably two oscillation exciters oriented parallel to each other, wherein each oscillation exciter comprises at least one piezo element, preferably two piezo elements, wherein each piezo element features a main direction of extension that extends parallel to the geometrical rotational axis of the bonding head. The term main direction of extension implies that the dimension of the piezo element in this direction is larger than in any other directions.

In particular in connection with the second embodiment of the invention it is preferred that the ultrasonic energy sources, particularly the voltage source, preferably its voltage frequency, is chosen or adjustable such that when applying the alternating voltage, the main direction of deformation of the oscillation exciter and/or the main direction of deformation of the piezo element respectively the piezo elements extends along the main direction of extension of the piezo element respectively the piezo elements.

In particular in connection with the third embodiment of the invention it is preferred that the design of the bonding head components that can be excited by the ultrasonic transducer and the alternating voltage, particularly its frequency, is chosen or adjustable to each other such that the pivot point and particularly the instantaneous center of rotation of the tool holder is located at a node of the bonding tool.

In respect to the aforementioned embodiments of the invention there is also the possibility that the frequency at the ultrasonic energy source, preferably the voltage frequency at the voltage source is chosen or adjustable such that it exactly or approximately equals a resonant frequency, preferably the lowest respectively the first resonant frequency, i.e. the first eigenmode, of the with applied alternating voltage oscillating subassembly, which includes the ultrasonic transducer, the tool holder, and the bonding tool. Preferably the oscillating system with the bonding tool can be excited to oscillations with its first eigenfrequency and thus in its according first eigenform, but oscillation excitation for e.g. the second or third etc. eigenfrequency/eigenform would also be possible. In another advantageous embodiment of the invention one or several piezo elements each in the shape of a rectangular delimited plate, wherein the edge length of the rectangular contour is larger than the thickness of the plate and wherein the polarization direction of each piezo element with respect to its plate plane is oriented lateral respectively perpendicular.

For the introduction of an oscillating transversal moment into the tool holder respectively into the bonding tool it is preferred that the ultrasonic transducer comprises at least two oscillation exciters arranged parallel to each other, wherein each oscillation exciter comprises a piezo element holder and two similar piezo elements, that are mounted planar to two surfaces of the piezo element holder that are parallel to, turned away from and opposite to each other, preferably with the planar surfaces glued to them. Thereby and in connection with the chosen frequency of the alternating voltage it can be achieved, that practically only the elongation change of the piezo elements in their main direction of extension is utilized for the oscillation excitation of the bonding tool. By means of the planar attachment of the piezo elements also the piezo holder element, which is preferably made from metal like e.g. steel or titanium, is deformed accordingly. Thus each oscillation exciter comprises a sandwich-like arrangement of a central piezo element holder between two opposing piezo elements. In connection with this configuration and the above mentioned parallel arrangement of two such oscillating exciters it is preferred that the polarization direction of piezo elements, which are constituents of the same oscillation exciter, are opposing each other with respect to their direction, thus quasi have opposite leading signs. In this context it is also preferred that the polarization direction of the two piezo elements that are attached to one of the two piezo element holders is oriented orthogonally away from the surface of the piezo element holder, and that the polarization direction of the two piezo elements, which are attached to the other of the two piezo element holders are oriented orthogonally towards the surface of the piezo element holder. With the above mentioned embodiments the desired different and particularly opposing changes in length of the two oscillation exciters can be realized with a particularly simple electrical circuitry, wherein all piezo elements are connected to the same respectively identical, thus also in-phase, alternating voltage and the piezo element carriers are e.g. grounded. In particular this provides the possibility to easily connect the piezo elements to a free surface, facing away from the piezo element holder, to the ultrasonic source, particularly to the voltage source e.g. by means of soldering joints. Thus an ultrasonic energy source respectively voltage course can the utilized, which provides only a single alternating voltage e.g. in the form $u(t)=U \cos(\omega t)$, and which is applied to all piezo elements, e.g. by wiring the connecting wires to all piezo elements in parallel. Another advantageous embodiment with respect to the previously described mode of operation is an arrangement where the geometrical longitudinal axis of the bonding tool extends parallel to the main direction of extension of the piezo elements and/or along the geometrical axis of rotation of the bonding head. A preferred space saving and stable embodiment comprises two piezo element holders that are constituents of the shared single piece transducer body, at which preferably also the tool holder for holding the bonding tool is implemented as a single piece. On that note it is also preferred that the transducer body integrally comprises a holding fork, with holder arms that on its longitudinal end connect to each one piezo element holder in its longitudinal center area.

In another embodiment of the invention an ultrasonic transducer comprises at least one transducer body and at least one oscillation exciting element that for the transmission of the oscillations produced by the oscillation exciting element itself is connected with the transducer body by suitable means, and it proposes for the further advantageous development, that the ultrasonic transducer preferably with the at its tool holder mounted bonding tool comprises an oscillation mode, comprising a waveform which produces a rotational oscillating movement with respect to at least one axis of rotation in the mounting point of the bonding tool. Alternatively said waveform in the mounting point of the bonding tool may produce a combined oscillatory excitation for rotation and translation. In a preferred embodiment of the invention the oscillation excitation element is mounted to the transducer body by force closure and/or form closure and/or material continuity (bonding, brazing, welding etc.). It is also preferred that the oscillating rotational movement is oriented with respect to at least one to the longitudinal axis of the bonding tool perpendicular or at least in general perpendicular imaginary respectively geometrical axis of rotation. In further detail a possible embodiment allows to span a hypothetical respectively geometrical reference plane through the geometrical longitudinal axis of the bonding tool or a hereto parallel geometrical line and through said rotational axis, that the at least one oscillation excitation element is located interspaced to the side and that the force exerted from the oscillation excitation element onto the transducer body acts into or predominantly into the direction respectively parallel to the (imaginary extended) longitudinal axis of the bonding tool. It is regarded as advantageous that at least two with respect to the reference plane sideways interspaced oscillation excitation elements are provided, that are arranged opposite of each other with respect to the reference plane. In another embodiment one or several ultrasonic energy sources, preferably one or several voltage sources or current sources, are provided for the energy supply of the oscillation excitation elements, which are connected to the oscillation excitation elements such that they perform oscillations that are phase shifted by 180°.

In a preferred embodiment a minimum of two oscillation excitation elements are arranged on each side of the reference plane, wherein on both respectively on different sides of the reference plane oscillation excitation elements are arranged in pairs opposite to each other, wherein on the same side of the reference plane neighboring oscillation excitation elements are connected with the energy source or the energy sources such that they perform oscillations with a phase shift of 180° to each other, and wherein oscillation excitation elements that are arranged in pairs and with respect to the reference plane opposite to each other are connected with the oscillation energy source or oscillation energy sources such that they perform oscillations with a phase shift to 180° to each other. A compact advantageous embodiment according to the invention particularly with respect to a minimum mass moment of inertia with respect to the tool's longitudinal axis is achieved with each at least two oscillation excitation elements that are arranged one behind the other on the same side of the reference plane in the direction of the geometrical longitudinal axis of the bonding tool. This provides the opportunity that the transducer body comprises only one oscillation excitation element carrier and that the oscillation excitation elements, preferably all oscillation excitation elements, by configuring only a single oscillation exciter, are located at two opposing, opposite sides facing surfaces of the oscillation excitation elements carrier, wherein the oscillation excitation element carrier exhibits at least substantially the form of a rectangular cuboid or of a rectangular plate. In so far such ultrasonic transducer is of a fundamentally different construction compared to the previously described ultrasonic transducer with two parallel to each other arranged oscillation exciters, but also allows the introduction of an oscillatory transversal torsional moment into the bonding tool at its tool holder. In one embodiment the oscillation exciter element is at least one piezo element such that the transducer body comprises only one piezo element holder, holding all piezo elements, which at least fundamentally features the form of a rectangular cuboid or a rectangular plate.

From the above it becomes clear that the bonding device according to the invention and its ultrasonic transducer fundamentally deviate from the state of the art. Known transducers usually used in ultrasonic welding are excited by one oscillation generator to perform longitudinal oscillations, and transmit those oscillations to a tool that is arranged perpendicular to the direction of oscillation exciting it to perform flexural oscillations. The invention in contrast targets a new design wherein the orthogonal alignment of the tool to the transducer is no longer necessary. Thus an improved construction with respect to the mass moment of inertia and the physical volume of the apparatus is achievable. In addition the manufacturing cost of the transducers may be reduced by using simplified body geometries (e.g. plates, plates with simple geometry) and by simplifying the assembly of actuators respectively oscillation excitation elements at the transducer. According to the embodiments of the invention already described above the invention proposes that the main direction of extension, i.e. the direction of the axis of the minimum moment of inertia of the transducer, and of the tool is identical. The transducer is excited to oscillations by oscillation exciters respectively oscillation excitation elements, such that a wave form develops at the operating frequency, that performs a fundamentally rotational movement at the mounting point of the tool and thus excites the tool in a node of its waveform to perform a transversal oscillation. In an embodiment according to the invention it is proposed that the transducer respectively transducer body consists fundamentally of two coupled areas of a preferably plate shaped body of arbitrary shape and as the case may be variable (particularly in direction of the extension staggered) thickness and excited by means of oscillation exciters respectively oscillation excitation elements to perform longitudinal oscillations, wherein the tool oscillates in the plane of the plate shaped body. Preferably at least two actuators (oscillation excitation elements) are mounted planar in the left or right area on opposing outer surfaces of the transducer that are parallel to the main direction of extension. Preferably the actuators are mounted e.g. by bonding, but fundamentally all connections by force closure, form closure and material continuity are possible alternatively or in combination. The driving of actuators opposing each other is preferably in phase. In one embodiment according to the invention at least four actuators (oscillation excitation elements) are mounted to two opposing outer surfaces of the two coupled areas that extend parallel to the main direction of extension. Within one area the actuators are again preferably driven in phase, whereas the two areas are driven in antiphase (phase is preferably 180°).

With regard to the direction of the main direction of extension and the aforementioned design this embodiment can be categorized as a vertical transducer, featuring two coupling areas.

Another embodiment according to the invention described above features a transducer consisting of a plate shaped body that is excited to oscillations by the oscillation exciter respectively the oscillation excitation elements that are mounted on two outer surfaces opposing each other and parallel to the transversal axis of the transducer. The tool oscillates, in contrast to the transducer consisting of two coupled partial bodies described above, perpendicular to the plane of the plate shaped body. This provides the opportunity to mount two actuators (oscillation excitation elements) on the outer surfaces in the upper half of the body and drive them in antiphase. One embodiment according to the invention comprises four actuators (oscillation excitation elements) mounted on the transducer, particularly two actuators on each side and one each in the upper and lower half. The actuators located on one side are preferably driven in antiphase. Hence the actuators located diagonally opposing each other are driven in phase. With respect to orientation and construction this embodiment can be categorized as a single-piece body vertical transducer.

The invention provides for other embodiment comprising combinations of a vertical transducer with two coupled areas and the single-piece body vertical transducer. These combinations enable the bonding tool in the mounting plane to not only oscillate on a straight line but also on a circular path and/or to perform an additional movement component perpendicular to the mounting plane.

The invention also relates to a process for producing bond connections preferably, i.e. not necessarily (other work pieces i.e. plastic parts or other parts that could be welded by ultrasound), between electrical conductors made of wire material or strip material and contact points of substrates such as electrical circuits, with the following process steps: Providing a bonding tool, providing an ultrasonic transducer for the ultrasonic excitation of the bonding tool, wherein the ultrasonic transducer comprises at least one oscillation exciter and the oscillation exciter comprises at least one piezo element, providing of an ultrasonic energy source to drive the piezo element preferably a voltage source to connect an alternating electrical voltage to the piezo element, and oscillation excitation of the bonding tool while pushing against the electrical conductor to be bonded by means of a bonding tool onto a contact point.

With respect to the statements above it is the objective of the invention to further develop advantageous embodiments of such process for producing bond connections.

The objective is accomplished by the invention firstly and fundamentally in connection with an embodiment wherein the oscillation excitation of the bonding tool the ultrasonic energy source, preferably the voltage source, preferably its ultrasonic frequency, is chosen or adjusted such that during operation, preferably with connecting to the alternating voltage, the main direction of deformation of the oscillation exciter and/or the main direction of deformation of the piezo element is oriented transversal to the polarization direction of the piezo element. The effects and advantages of this embodiment are referenced above particularly in the explanations pertaining to the second embodiment according to the invention.

The invention also relates to a process for producing bond connections preferably between electrical conductors made of wire material or strip material and contact points of substrates such as electrical circuits, with the following process steps: Providing a bonding tool and an ultrasonic transducer for the ultrasonic excitation of the bonding tool and oscillation excitation of the bonding tool while pushing against the electrical conductor to be bonded by means of a bonding tool onto a contact point.

For the advantageous further development of such process the invention proposes, that for its oscillation excitation an oscillating transversal moment is applied to the bonding tool at the tool holder, wherein the geometrical axis of rotation of the transversal torsional moment is oriented transversal to the tool's longitudinal axis. Alternatively an advantageous further development of the process according to the invention is that for its oscillation excitation an oscillating transversal moment and an oscillating translatory excitation is applied to the bonding tool at the tool holder. In order to hold the bonding tool at the bonding device respectively at the bonding head a tool holder holds the bonding tool, preferably at its upper end. The effects and advantages of this embodiment are referenced above particularly in the explanations pertaining to the third embodiment according to the invention. Preferably the process may be performed such that the oscillating transversal moment is applied at the location of a node of the bonding tool.

From the above it can be concluded that for the energy supply of the oscillation exciter or the oscillation exciters preferably but not necessarily a voltage source can be chosen. Alternatively e.g. one or several current sources or other types of energy sources (e.g. a magnetic energy source) may serve as energy source for the generation of ultrasonic oscillation (i.e. as ultrasonic energy source). In the context of the different embodiments according to the invention the term oscillation exciter is defined in general as a holder with at least two attached oscillation exciter elements, i.e. with at least one actuator, wherein the actuator can generally be based on a piezo-electrical working principle (if implemented as a piezo element) or on a magnetostrictive working principle.

The aforementioned processes according to the invention preferably comprise an ultrasonic transducer respectively a bonding device that exhibit one or several of the aforementioned and/or subsequently described attributes.

BRIEF DESCRIPTION OF THE SEVERAL VIEWS OF THE DRAWINGS

In the following preferred embodiments of the invention will be explained in more detail with reference to the illustrations below. They show:

FIG. 6 a side view of the transducer body in viewing direction VI according to FIG. 5 with a partial cross sectional view at its lower end;

FIG. 7 a side view similar to FIG. 3, which shows exemplary and schematically simplified areas of piezo elements with deformations of various magnitudes;

FIG. 8 an example of a preferred holder of the ultrasonic transducer for the attachment of the bonding head, as an alternative embodiment to FIG. 1;

FIG. 9 a perspective view of an ultrasonic transducer according to the invention with an inserted bonding tool according to a further preferred embodiment;

FIG. 10*a* a cross sectional view along sectional plane Xa in FIG. 9 in slightly smaller scale and FIG. 10*b* a cross sectional view according to FIG. 10*a* wherein a momentary waveform is indicated in a simplified schematic manner by means of a dashed winding line.

DETAILED DESCRIPTION OF THE INVENTION

Figure 1:
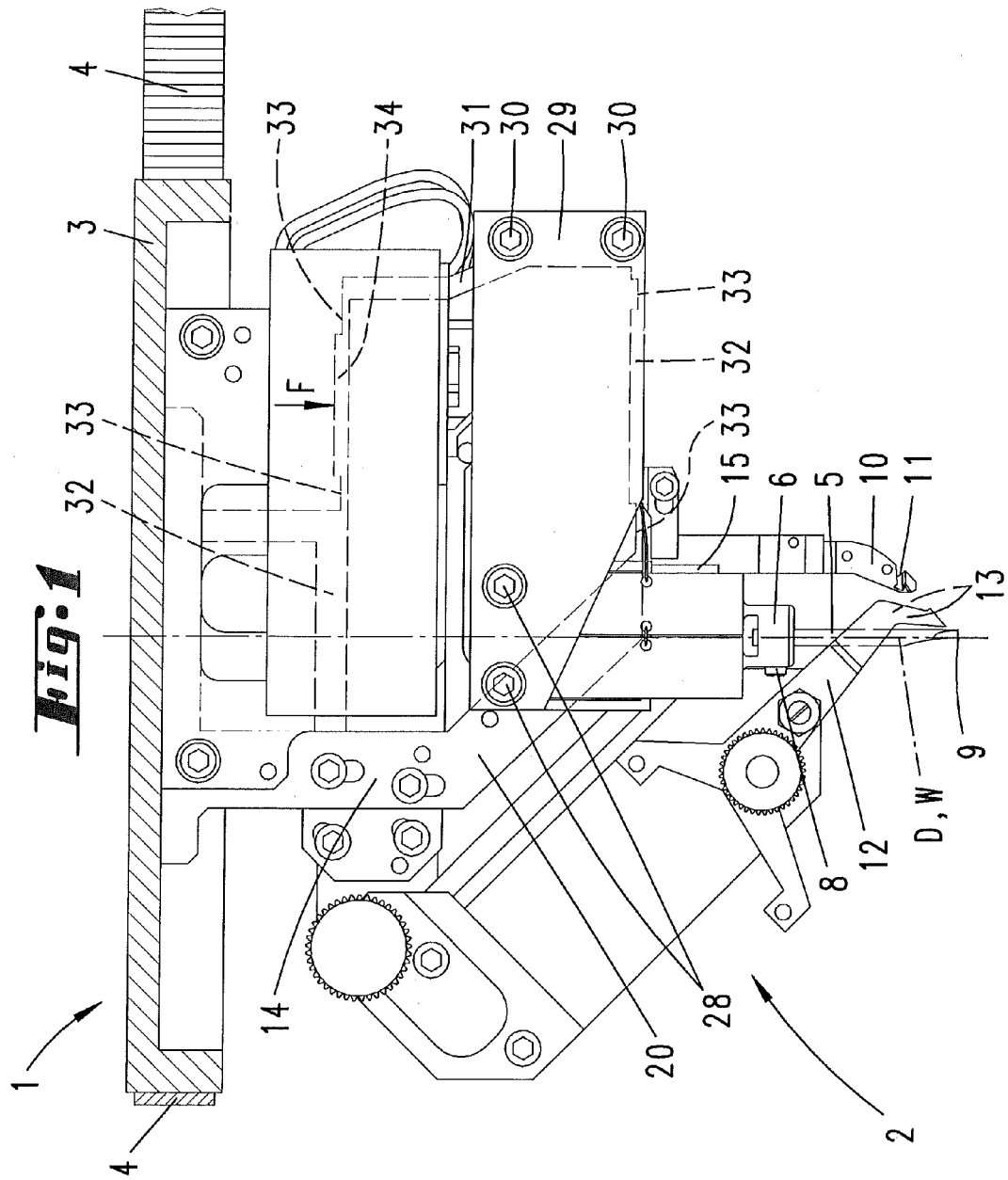
FIG. 1 a side view of a preferable embodiment of a bonding head of a bonding device according of the invention.

With respect to FIGS. 1 through 6 a preferred embodiment of a bonding device according to the invention and a process for producing bond connections according to the invention is described, wherein FIG. 1 shows the bonding device 1 only in the area of the bonding head and the FIGS. 2 through 6 depict magnified views of components of the bonding head 2. In a way not depicted here in detail the bonding head 2 is mounted at the underside of a pulley 3 which is attached rotatable to the bonding device 1 around the vertical oriented axis of rotation D. To perform a rotational movement in this embodiment a partially shown toothed belt 4 that engages with the teeth on the outer perimeter of a toothed pulley 3 may by means of a driven pulley it is wound around and not shown here is moved a desired distance depending on the angle of rotation. In addition drive systems may be provided to move the entire bonding head 2 sideways in varying directions of a plane perpendicular to the axis of rotation D. The bonding head 2 comprises an elongated bonding tool 5 that extends along a center longitudinal axis W. At its upper longitudinal end it is inserted with its shaft into a tool holder 6 into a likewise vertical bore 7 of according diameter (compare FIG. 6) and in there secured with a clamp screw. At the lower longitudinal end the bonding tool 5 comprises a tool tip 9 that may push an electrical conductor, made e.g. of wire material or strip material, with its lower face in a known manner against a contact point of the substrate selected for a bond connection, preferably a contact of an electrical circuit. In order to provide the bonding location with a wire or strip conductor the bonding device comprises a wire feed device 10 with a guiding grove 11 at is lower end that is open to the side. In order to steady the electrical conductor at defined points in time during the bonding process and to be able to exert a tension on the electrical conductor the bonding device comprises a clamp device 12, with two clamp legs 13 overlapping each other in the viewing direction of FIG. 1, with their unoccupied ends located between the tool tip 9 and the lower end of the wire feed device 10. The generally known functionality of the wire feeding device and the clamp device does not need to be explained here in detail. Both components are adjustable in position and may be locked into a desired position with respect to the pulley 3 respectively a stiff holding arm attached at it with suitable means. The tool holder 6 is formed as a single piece to the lower end of the transducer body 15 shown in detail in FIGS. 5 and 6. The transducer body 15 made in a plate-like form from an electrically conductive material (e.g. steel) incidentally comprises two each rectangular delimited piezo element holders 16 with a main direction of extension 17 extending parallel to the geometrical axis of rotation D and the coinciding or just minimally interspaced tool axis W. In each case in the approximate area of the middle lower edge a connecting web 18 emanates from each piezo element holder, with each lower end of which the two piezo element holders 16 are attached sideways interspaced to each other (i.e. interspaced to each other transversal to the axis of rotation D) to the upper side of the tool holder 6. In addition the transducer body 16 comprises a retaining fork 19 to hold the piezo element carriers 16 at the bonding head 2. For this purpose two retaining arms 20 of the retaining fork 19 contact each one piezo element holder 16 in its longitudinal center area (with respect to the extension respectively the dimension in the main direction of extension 17) as a single piece at its lower longitudinal end 21. In the same height the piezo element holders 16 that extend parallel to the main direction of extension 17 are connected by means of a material bridge 22. Apart from that the two piezo element holders 16 are interspaced from each other with narrow slots 23, 24 and from the retaining fork 19 by means of narrow slots 25, 26. In its upper area the retaining fork 19 comprises through holes 27, to mount to the transducer body 15 by means of screws 28 firmly to a plate 29. The plate 29 is bolted with screws 30 to a frame section 31 that is like the retaining arm 20 a component of the, to the underside of the pulley 3 mounted, assembly frame 32. In FIG. 1 this frame in depicted by a dashed line where it is covered by other components. As depicted the assembly frame 32 comprises four sections 33 with a comparatively reduced frame cross section exhibiting a comparatively lower stiffness and that due to their flexibility serve as solid state pivots. The with respect to FIG. 1 left edge of the assembly frame 32 is like the retaining arm 20 rigidly mounted to the pulley 3, whereas the frame section 31 to the right in viewing direction due to the solid state pivots by a force F that may be performed by an actuator, that is not shown, on the frame section 34, may be deflected relative hereto for a certain distance downwards to e.g. press the bonding tool 5 downwards onto the bonding point. When the force F is removed the frame section 31 will elastically return to its rest position.

Figure 2:
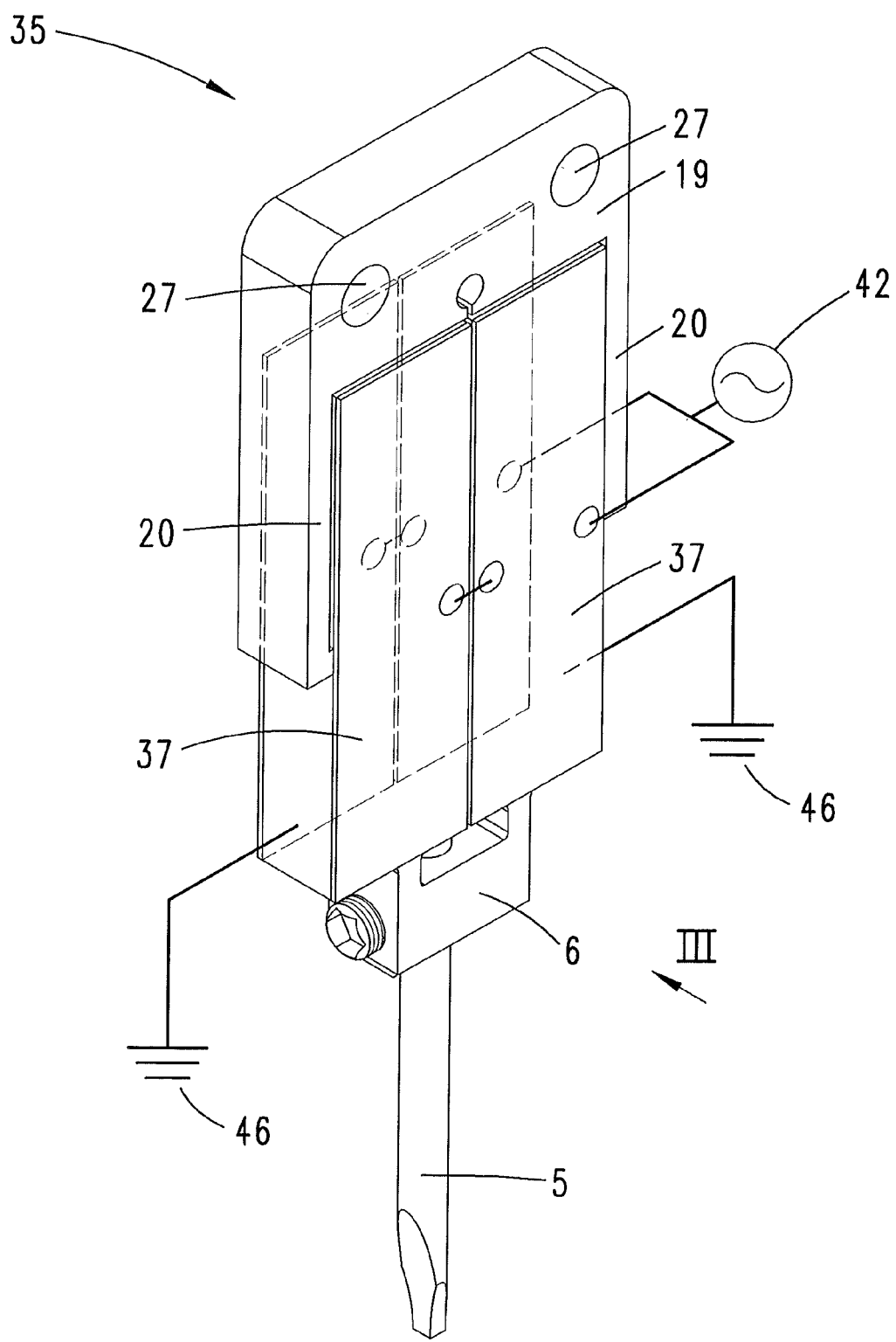
FIG. 2 a magnified perspective view of the transducer shown in FIG. 1.
Figure 3:
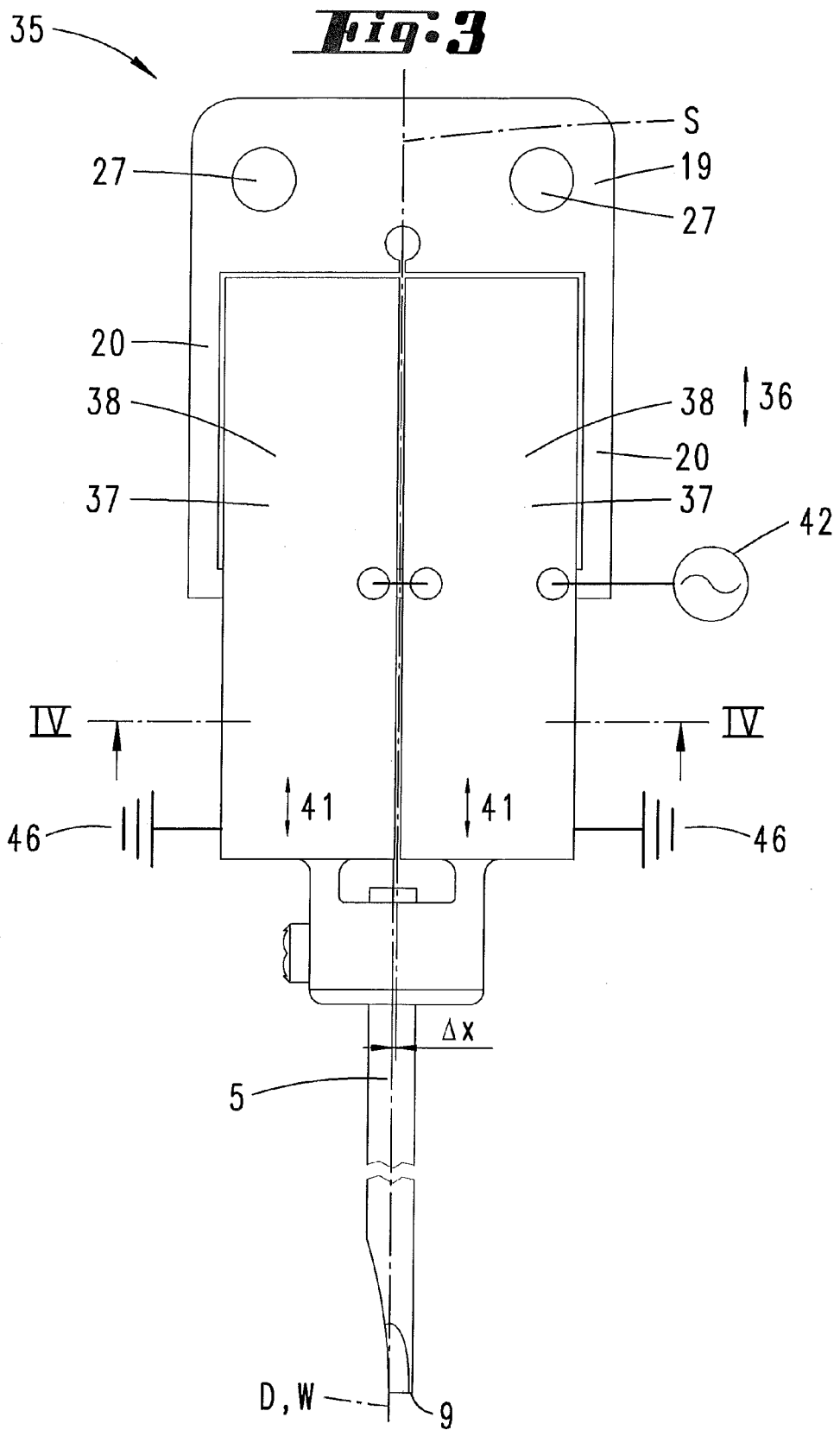
FIG. 3 a side view of the ultrasonic transducer in viewing direction III according to FIG. 2.
Figure 4:
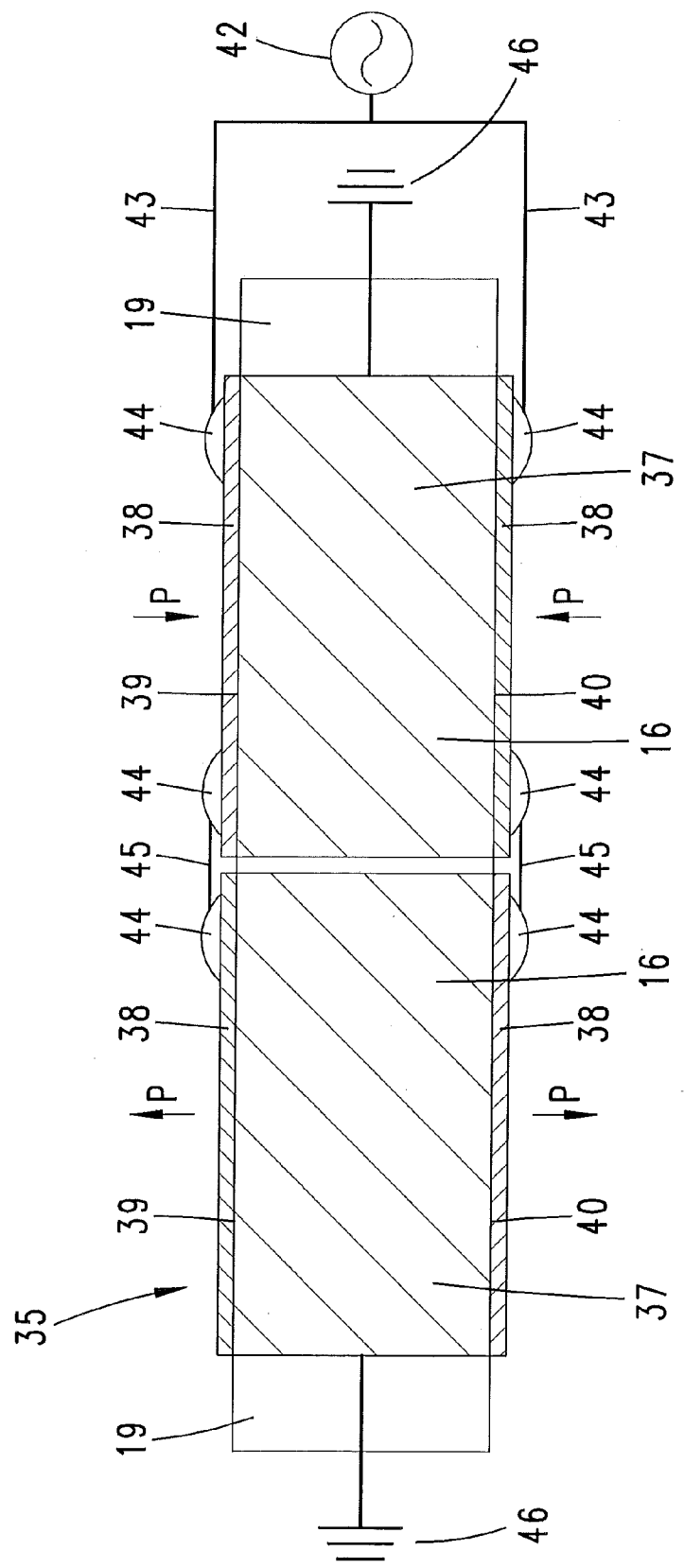
FIG. 4 a magnified cross sectional view of the ultrasonic transducer along intersecting line IV-IV according to FIG. 3.
Figure 5:
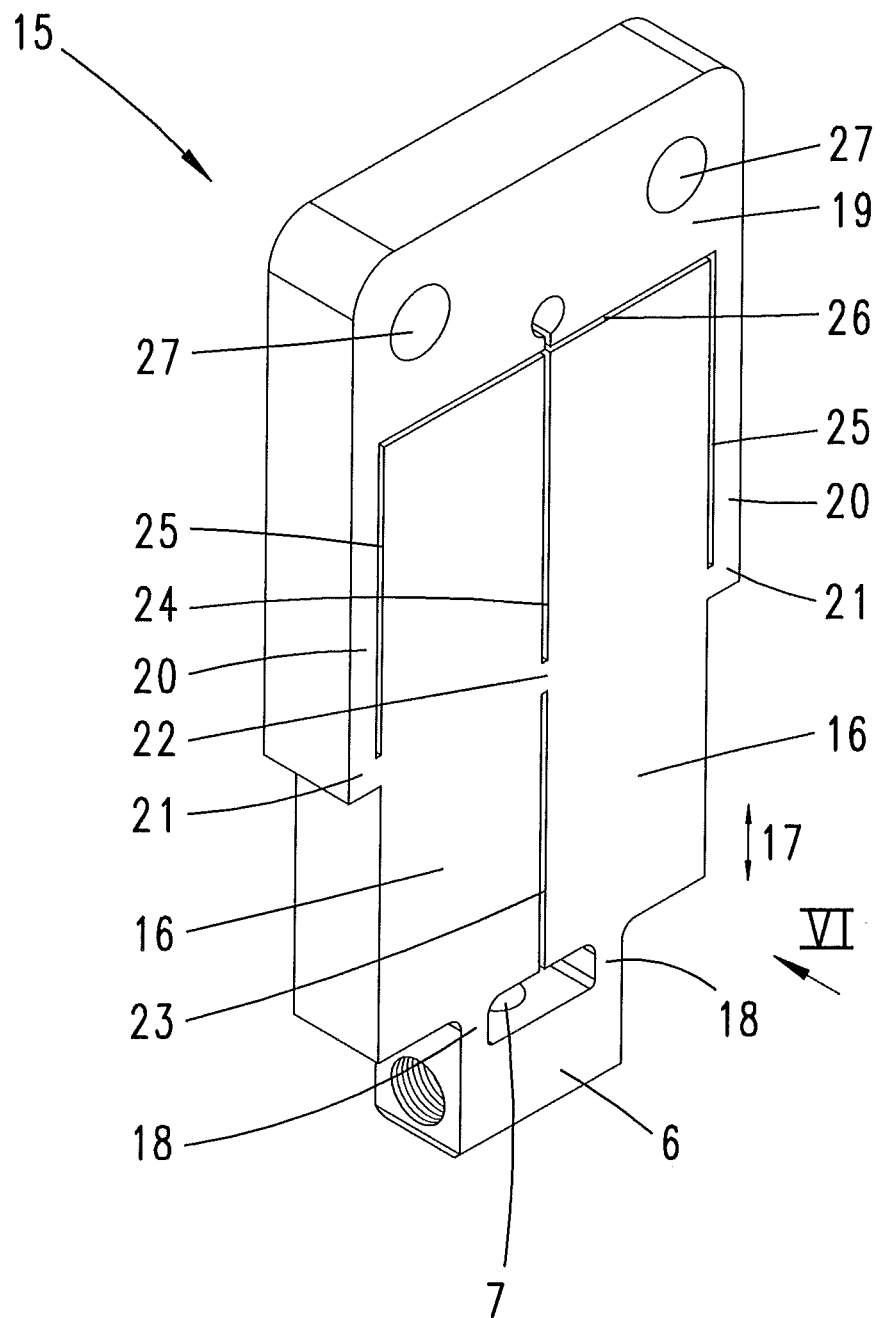
FIG. 5 a perspective view of the transducer body of the ultrasonic transducer shown in FIG. 2

The FIGS. 2 through 4 show the transducer body 15 of the ultrasonic transducer 35, as a component of the bonding head which is shown in FIG. 1, with the bonding tool 5 inserted in its tool holder 6. From FIGS. 1 and 3 e.g. it is evident that the main direction of extension 36 of the ultrasonic transducer 35 may extend parallel to the geometrical axis of rotation D of the bonding head, which is coinciding with or just minimally interspaced from the tool axis W of the bonding tool. Based on the mainly symmetrical construction of the ultrasonic transducer 35, as chosen in the example, its longitudinal axis of symmetry S, apart from a small sideways displacement (compare $\Delta X$ in FIG. 3), also coincides with the geometrical axis D and W. The ultrasonic transducer 35 that is shown magnified in FIGS. 2 through 4 comprises two neighboring oscillation exciters 37 oriented parallel to each other. Each oscillation exciter 37 comprises one of the two piezo element holders 16 as well as each two plate shaped, in their main direction of extension (compare FIG. 3) rectangular delimited piezo elements 38, from which the two corresponding piezo elements that are each assigned to one oscillation exciters are bonded planar onto the two opposing and parallel surfaces 39, 40 that are facing away from each other, of the according piezo element holder 16 across the entire contact surface. FIGS. 2 and 3 show that in this contact plane (i.e. parallel to the drawing plane of FIG. 3) the delimitation respectively the shape of the piezo element holder 16 and of the piezo elements bonded thereon is identical, wherein an accurately fitting and aligned bonding is present. From this results that also the main direction of extension 41 of the piezo elements 38 is oriented parallel to the geometrical axis of rotation D of the bonding head 2. The chosen piezo elements can be described as plate shaped because their dimension in the main plane of extension, which is in parallel to the drawing plane of FIG. 3, is larger that the thickness of the hereto perpendicular and parallel to the drawing plane of FIG. 4 extending plane. In FIG. 4 the polarization direction of each piezo element is given and depicted with arrows that are marked with the reference sign P. As can be seen the polarization direction P of each piezo element 38 extends perpendicular to its plate plane. Also shown is that at each pair of piezo elements 38, that belongs to the same oscillation exciter, the polarization directions are oriented in opposing directions with respect to each other. In further detail of the embodiment shown in FIG. 4 the polarization directions P of the piezo elements 38 of the, with respect to the viewing direction, left oscillation exciter 37 extend perpendicular away from the contact planes 39, 40, i.e. to the outside. In contrast hereto the polarization directions P of the piezo elements 38 of the oscillation exciter located to the right with respect to the viewing direction are oriented each perpendicular in direction of the according contact pane 39, 40, i.e. to the inside. The ultrasonic transducer in the shown example is connected to a voltage source 42 by attaching two electrical conductors 43 coming from said voltage source that are connected in parallel and that are attached at their ends by means of solder joints 44 to two piezo elements opposing each other on the same (located on the right in FIG. 4) piezo element holder 16. The symbol shown in FIG. 4 denotes that the voltage source 42 is an alternating voltage source. Alternatively other ultrasonic energy sources (i.e. energy sources for the generation of ultrasound), e.g. an alternating current source may be utilized. By means of additional electrical conductors 45 and their solder joints 44 pairs of piezo element holders 38, which are bonded onto the neighboring piezo element holders within the same plane, are connected electrically conducting. In the example selected here also the respective bonded joints between the piezo elements 38 and the piezo element holders 16 are manufactured electrically conductive, alternatively an electrically not conducting bonded joint would also be possible. The piezo element holders 16 are, as labeled by the reference numerals 46, each (or together) grounded. Thus the same alternating voltage with respect to magnitude and phasing is connected to each of the four piezo elements 38 perpendicular to their plate plane, when the voltage source 42 is turned on.

While FIG. 3 shows the ultrasonic transducer 35 and the bonding tool 5 mounted therein with the voltage source 42 turned off, FIG. 7 for comparison depicts schematically simplified and exemplary the deformations of the oscillation exciters, the tool holder 6, and the bonding tool 5 caused by the piezo electrical effect with the voltage source turned on at a defined point in time, i.e. during application of an alternating electrical voltage with an exemplary frequency and amplitude chosen for the calculations. For simplification the small deformations that also occur in the area of the retaining fork 19 are not shown. Shown is the overall deformation of a so-called main mode, wherein for the purpose of the calculation the surface of the piezo elements 38 was segmented into fields 47, delimited by grids. From the diagram-like illustration it can be seen that the relative positional deviation is smallest along an approximately central zone, connecting the longitudinal ends 21 of the two retaining arms 20, and largest at the two longitudinal ends of the piezo elements. In comparison with FIG. 3 it can be clearly seen that the piezo elements 18 to the left, with respect to the viewing direction, with the piezo element carrier located in between, i.e. the oscillation exciter 37 located left with respect to the viewing direction, undergoes a contraction respectively linear shortening in the assigned main direction of extension 17 respectively 41, by the applied alternating voltage during the considered point in time in comparison to the idle state with no voltage applied (see FIG. 3), while the neighboring Oscillation exciter 37 to the right, including its two piezo elements 38 and its piezo element holder 16, undergoes a linear expansion at this point and in time in this direction. Despite the electrical voltage being identical at all piezo elements at any given point in time the two pairs perform oscillating deformation oscillations that are shifted by half a phase length with respect to each other caused by the different polarization directions as described above. The numeral values assigned to the different hatching styles show as comparative values the according relative position deviation of the areas compared to the idle state with no voltage applied shown in FIG. 3. Due to the opposing changes in length of the two parallel oscillation exciters 37 the tool holder 48 is, compared to the idle state with no voltage applied as shown in FIG. 3, lifted at its left longitudinal end and lowered at its right longitudinal end, such that with respect to the pivot point $P_M$ a torsion results in direction of the arrow 48. The pivot point $P_M$ is located at the upper longitudinal end of the bonding tool 5 that is attached to the tool holder, wherein the geometrical axis of rotation of the torsion extends through the point $P_M$ perpendicular to the drawing plane of FIG. 7 and in so far also perpendicular to the longitudinal extension of the bonding tool 5. Although all four piezo elements 38 are connected to the same voltage the desired opposing change in length at the two oscillation exciters 37 is achieved, because the polarization direction P of the piezo elements 38 is oriented in opposing directions between the two oscillation exciters 37. Because the magnitude and leading sign of the alternating voltage, whose frequency is in the ultrasonic range, thus the momentary magnitude, constantly changes, which also results in a change in length of the oscillation exciters 37 at the corresponding frequency, wherein inter alia at certain points in time both oscillation exciters 37 exhibit the same length and inter alia at other points in time exhibit the length ratios that are opposed to FIG. 7. This results in an excitation of oscillating rotational movements of the tool holder 6 around the axis of rotation extending through the point $P_M$, such that at the point $P_M$ an oscillating transversal moment M is transmitted into the bonding tool 5. Thus the bonding tool 5, as shown in FIG. 7, is excited to perform a transversal oscillation. For comparison FIG. 7 also shows the tools longitudinal axis W at the idle state with no applied voltage as it is shown in FIG. 3. The center point of the rotational movement is located on this reference line W, i.e. it represents a so-called node of the eigenform. The tool tip 9 in contrast exhibits a pronounced deflection perpendicular to the reference line, i.e. it is located at a so-called antinode. In the course of the oscillation cycles the tool tip 9 moves mainly perpendicular to the tool axis W. While pressing an electrical conductor that is to be bonded onto a substrate (not shown here) with a tool tip 9 the conductor is also excited to oscillations relative to the substrate thus creating a bond connection.

In the embodiments according to the invention shown in FIGS. 3 and 7 the voltage source 42 (which is not shown in FIG. 7) is tuned to the entire oscillating system with respect to the generated alternating voltage and its voltage frequency such that with application of the alternating voltage the geometrical deformation lines 49 of the two oscillation exciters 37, which correspond to the main geometrical deformation lines 50 of the piezo elements 38, extend perpendicular to the polarization direction P of the piezo elements 38. The main geometrical deformation lines 49, 50 correspond to the main direction of deformation that is independent from the leading sign. In FIG. 7 the axis of rotation extending perpendicular to the drawing plane through the point $P_M$ is marked with A and the transversal moment transmitted into the bonding tool 5 with respect to this axis is marked with the reference sign M.

FIG. 8 shows the discussed ultrasonic transducer 35 mainly in a cross sectional side view in connection with an assembly frame 32 that has a different design compared to the one shown in FIG. 1. It can be mounted preferably to the pulley 3 shown in FIG. 1 by means of a screw connection 51 that is only indicated here, i.e. it can be inserted into the bonding head shown in FIG. 1 instead of the assembly frame 32 that is shown there. At the ends 52 of the lower cross members that point to each other the assembly frame 32 is attached to each one piezo element holder 16. This attachment may be done integral respectively as a single piece or with several parts by any suitable means (e.g. through bonding, screw connection and the like). In a preferred embodiment according to the invention wherein the connections are done as a single piece at the locations with reference numeral 52, the combination of the transducer body 15 and assembly frame 32 is a single component. Based on the illustration shown in FIG. 8 the hatching in the area of the piezo element holders 16 would then be chosen to be identical to the hatching of the assembly frame 32. The connection in each case takes place in a central longitudinal area of the oscillation exciters 37 on the level of the material bridge 22, such that a separate retaining fork 19 (compare FIG. 1) can be omitted. In the lower cross member 53 paired sections 33 with reduced frame cross section and that serve as solid state pivots are provided, each adjoining to the ultrasonic transducer 35 and the vertical members 54. Thus a single piece transducer parallelogram is formed that allows for a certain elastic lowering of the bonding tool 5 by means of a downwards oriented contact force F. The contact force F may be applied e.g. at the material bridge 22, as shown in FIG. 8, or at other locations of the transducer.

In FIGS. 9 and 10*a*, 10*b* another preferred embodiment of an Ultrasonic transducer 35 according to the invention is shown that is different from the previous figures. For ease of presentation with regard to according attributes the same reference signs and numerals as above are used. In FIGS. 9 and 10 a bonding tool 5 is inserted into the ultrasonic transducer 35, and attached in it (compare also FIGS. 10*a*, 10*b*) by means of a clamp screw 8. The ultrasonic transducer 35 comprises a transducer body 15, which is apart from a bore 7 for the insertion of the bonding tool 5 and a threaded bore to screw in the clamp screw, a rectangular cuboid made from a single piece of material. In the shown example the ultrasonic transducer 35 comprises a total of four oscillation excitation elements 55, each one plate shaped piezo element 38. Two of these piezo elements 38, are arranged one behind the other with respect to the direction of the longitudinal axis of the tool W, and bonded planar onto one side respectively onto the same surface 39 of the transducer body 15, wherein the piezo element 38 that is facing the bonding tool 5 comprises an opening for the clamp screw 8. On the opposing surface 40 that is extending in parallel to surface 39 two additional piezo elements 38 are bonded that are aligned to the aforementioned piezo elements with respect to the projection. In so far the transducer body 15 in the example of FIGS. 9 and 10 comprises only one piezo element holder 16. FIG. 10*b* shows schematically simplified that the ultrasonic transducer 35 with the attached bonding tool 5, exhibits an oscillation mode with a waveform in the mounting point 56 of the bonding tool 5, at which the clamping occurs, that causes a rotational oscillating movement around an imaginary respectively geometrical axis of rotation A, that extends through the node on the level of the mounting point 56 parallel to the drawing plane of FIG. 10*b*. In so far also an imaginary respectively geometrical reference plane E in FIG. 10*b* that is perpendicular to the drawing plane of FIG. 10*b* is spanned by the longitudinal axis of the tool W (i.e. the longitudinal direction of the tool) and said rotational axis A. It becomes apparent that all four oscillation excitation elements 55 (i.e. all piezo elements 38) are arranged sideways interspaced with respect to reference plane E respectively in a direction perpendicular to the extension plane of the piezo elements 38. FIG. 10*a* shows the respective polarization directions P of these four piezo elements 38. On the left side with respect to the viewing direction the upper piezo element 38 comprises a polarization direction P that points away from the surface 39, whereas the lower piezo element 38 comprises a polarization direction P that points towards the surface 39. On the opposing side the upper piezo element 38 comprises a polarization direction P that points towards the surface 40 and the lower piezo element 38 comprises a polarization direction P that points away from the surface 40. For the case that the oscillation excitation element holder 57, that in this example because of the use of piezo elements as oscillation exciters is the piezo element carrier 16, is e.g. grounded and an alternating voltage that is in phase is connected to the free surfaces of the piezo elements 38, alternating elongations and contractions that change in time, result within the planes of the piezo elements 38 and thus also or even mainly in parallel to the imaginary extension of the longitudinal axis of the tool. The arrows shown in FIG. 10b depict that the two piezo elements 38 with their polarization direction P pointing to the transducer body 15 experience a length change (at the depicted point in time an elongation) in phase to each other and that the two other piezo elements 38 with a polarization direction pointing away from the transducer body 15 also experience a length change (at the depicted point in time a compression) in phase to each other, but in opposing direction with respect to the aforementioned piezo elements 38. Thus the two piezo elements 38 that are arranged aligned opposing each other with respect to the reference plane E experience length changes opposed to each other. Also each two piezo elements 38 bonded to the same surface (39 or 40) experience length changes opposed to each other. In FIGS. 9 and 10a, 10b the voltage supply respectively current supply of the piezo elements 38 is not shown. As discussed above the transducer body may be e.g. grounded (or connected to another potential) and to the free surface of all piezo elements 38, e.g. also by means of electrically conducting connections between them, an alternating voltage in phase to each other may be applied.

The transducer body 15 is a basic cuboid body made from a metallic material, with its longest side standing vertically i.e. extending in the direction of the extension of the longitudinal axis of the tool W. Because of the above described length changes in opposite directions of the piezo elements 38, the transducer body 15 performs a transversal oscillation, wherein the cross section in "bending direction", i.e. in with respect to the viewing direction of FIGS. 10a, 10b sideways respectively horizontal direction, exhibits the smallest elongation. Preferably and in the shown example the transducer body oscillates, as shown in FIG. 10b, in its second transversal eigenmode. With two free edges this eigenmode comprises three nodes, wherein the lowest is located at the level of the mounting point 56 of the bonding tool 5. Below that in this example three other nodes, also marked with reference numerator 58, are distributed along the length of the bonding tool 5. Thus the bonding tool 5 also performs transversal modes. The bonding tool 5 and the transducer body 15 are tuned with respect to their geometrical dimensions and the material properties such that each of them exhibits approximately the same eigenfrequency (for the above mentioned eigenmodes). When these two components are assembled together, the overall system also shows an according eigenfrequency. Thereby it is preferred (as shown), that the upper node 58 of the bonding tool 5 and the lower node 58 of the transducer body 15 are located at the same point. At this same location respectively on this level also the clamp of the bonding tool 5 by means of the clamp screw 8 (in the example a set screw) is located. Accordingly the bonding tool 5 carries forward the transversal oscillation of the transducer body 15 almost seamlessly. To be able to clamp the bonding tool 5, the bore 7 in the form of a tapped blind hole for the bonding tool 5 is not located exactly in the center of the flexural plane of the transducer body 15, wherein however a small offset is affecting the oscillation behavior only minimally. Alternatively a suspension of the bonding tool in the ideal center of the flexural plane would be possible. In the plane orthogonal to the flexural plane the bonding tool 5 in the example is located in the ideal center.

In the exemplary embodiment (compare FIG. 9) the suspension of the ultrasonic transducer 35 respectively its mounting to the bonding head may be accomplished by means of two connecting devices 59 that are mounted opposing each other on the two surfaces on the side of the transducer body that are orthogonal to surfaces 39, 40. They each comprise a connecting bore 60 in or through which the not depicted mounting screws for the mounting at the bonding head may be routed to the bond head. Each connecting device comprises a solid state pivot 61 (i.e. a total of four solid state pivots 61) above and below the connecting bore 60, wherein these regions exhibit a small cross section in order to de-couple the transversal torsional oscillations. Preferably these flexure zones are located exactly on the level of the upper and the middle node 58 of the transducer body 15 (compare FIG. 10b). Here the base body performs a quasi pure rotation, whereby the pivot joints perform ideally and in this way may de-couple the oscillation system from the environment. Alternative variants are possible wherein the solid state pivots are located on the level of the upper and lower node 58 of the transducer body 15 or on the level of the middle and the lower node 58 of the transducer body 15. Above and below the solid state pivots 61 connections of the connecting device 59 with the transducer body 15 are located. Preferably these connecting devices 59 are made as a single piece respectively integrally, i.e. the suspension and the base body are one piece, and other deviating embodiments are also possible.

In the exemplary embodiments shown in FIGS. 9 and 10 the ultrasonic oscillation are also produced by thin piezo plates. Also here the oscillation direction that is orthogonal to the polarization direction P and to the electrical field is utilized. As described above in order to achieve the ideal excitation of the oscillation mode of the base body (particularly the second flexural mode), four piezo elements 38 are utilized, wherein the each diagonally opposing elements synchronously perform elongations and contractions that change in time. Variants are possible e.g. thereby that either the piezo elements 38 that are bonded to the two surfaces 39 or the piezo elements 38 that are bonded to the two surfaces 40 are omitted. Also in the hereby generated embodiment the transducer body 15 would be excited to a second transversal mode. Another variant would be possible with the in respect to the FIGS. 10a, 10b if either the two upper or the two lower piezo elements 38 would be omitted. In such a configuration the transducer body 15 would be excited to its first transversal mode, such that also here with suitable tuning an oscillating transmission of the transversal moment into the bonding tool 5 occurs. Analogous also embodiments are possible wherein based on the FIGS. 9 and 10 on each surface 39, 40 one or more additional piezo elements 38 are arranged one behind the other in the direction of the extension of the longitudinal axis of the tool W, to thereby excite the transducer body 15 to higher transversal modes.

All embodiments and attributes disclosed herein are (for themselves) essential for the invention. In the disclosure of the application herewith also the disclosed content of the according/enclosed priority documentation (copy of the provisional application) is included with its full content, also for the purpose to include attributes and embodiments from this document in the claims of the present application.

The invention claimed is:

1. A bonding device, wherein the bonding device comprises a bonding head (2) which can be rotated about a geometric axis of rotation (D), on which a bonding tool (5) and an ultrasonic transducer (35) for ultrasonic vibration excitation of the bonding tool are disposed, the bonding tool being rotatably mounted to the ultrasonic transducer at a mounting point of a tool holder, wherein the main direction of extension (36) of the ultrasonic transducer (35) is along an axis of a minimum mass moment of inertia and extends in parallel to the geometrical axis of rotation (D) of the bonding head (2), and wherein the transducer is excited to oscillations by oscillation exciters or oscillation excitation elements, such that a wave form develops at the operating frequency that performs a fundamentally rotational movement of the mounting point of the tool and thus excites the tool in a node of its wave form to perform a transversal oscillation.

2. The bonding device according to claim 1, wherein the bonding tool is a wedge, and where the wedge is mounted in a tool receptacle.

3. The bonding device according to claim 1, wherein the geometrical longitudinal center line (S) of the ultrasonic transducer (35) extends parallel to the geometrical rotational axis (D) of the bonding head (2), and/or parallel to the longitudinal center line (W) of the bonding tool (5).

4. The bonding device according claim 1, wherein the ultrasonic transducer (35) comprises at least one oscillation exciter (37), and each oscillation exciter (37) comprises at least one piezo element (38), wherein each piezo element (38) features a main direction of extension (41) that extends parallel to the geometrical rotational axis (D) of the bonding (2) head.

5. The bonding device according to claim 4, wherein an ultrasonic energy source, is matched or adjustable such that when applying an alternating voltage, a main direction of deformation of the oscillation exciter (37) extends at least mainly into the main direction of extension (41) of the piezo element (38).

6. The bonding device according to claim 1, wherein the frequency of the ultrasonic energy source is chosen or adjustable such that it at least approximately equals a resonant frequency of the oscillating subassembly with applied alternating voltage, which includes the ultrasonic transducer (35), the tool holder (6), and the bonding tool (5).

7. The bonding device according to claim 4, wherein one or several piezo elements (38) each has the shape of a rectangular delimited plate, wherein the polarization direction (P) of each piezo element (38) is oriented lateral with respect to its plate plane.

8. The bonding device according to claim 1, wherein the ultrasonic transducer (35) comprises at least two oscillation exciters (37) arranged parallel to each other, wherein each oscillation exciter (37) comprises a piezo element holder (16) and two similar piezo elements (38), that are mounted planar to two surfaces (39, 40) of the piezo element holder (16) that are parallel to and opposite to each other.

9. The bonding device according to claim 8, wherein polarization directions (P) of the piezo elements (38) that are constituents of the same oscillation exciter are opposing each other with respect to their direction.

10. The bonding device according to claim 8, wherein polarization directions (P) of the two piezo elements (38) that are attached to one of the two piezo element holders (16) are oriented away from the surface of the piezo element holder (16), and that the polarization direction (P) of the two piezo elements (38), which are attached to the other of the two piezo element holders (16) are oriented towards the surface of the piezo element holder (16).

11. The bonding device according to claim 8, wherein the piezo elements (38) are connected to the ultrasonic energy source, on their free surface facing away from the piezo element holder (16), and that the piezo element holders (16) are grounded.

12. The bonding device according to claim 4, wherein the bonding tool comprises a geometrical longitudinal tool axis (W) that extends parallel to the main direction of extension (41) of the piezo elements (38) and/or extends along the geometrical axis of rotation (D) of the bonding head (2).

13. The bonding device according to claim 8, wherein the two piezo element holders (16) are constituents of a shared single piece transducer body (15), and/or that the tool holder (6) is implemented as a single piece.

14. The bonding device according to claim 13, wherein the transducer body (15) comprises a holding fork (19), with holder arms (20) that on their its longitudinal ends (21) each engage respectively one piezo element holder (16) in its longitudinal center area.

* * * * *